US012575239B2

(12) United States Patent
Qin et al.

(10) Patent No.: US 12,575,239 B2
(45) Date of Patent: Mar. 10, 2026

(54) ARRAY SUBSTRATES AND DISPLAY DEVICES

(71) Applicants: Hefei BOE Ruisheng Technology Co., Ltd., Hefei (CN); BOE Technology Group Co., Ltd., Beijing (CN)

(72) Inventors: Jianwei Qin, Beijing (CN); Liang Gao, Beijing (CN); Bing Zhang, Beijing (CN); Chaoren Lv, Beijing (CN); Yiding Sun, Beijing (CN); Huangfei Cha, Beijing (CN)

(73) Assignees: Hefei BOE Ruisheng Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 373 days.

(21) Appl. No.: 18/037,040

(22) PCT Filed: Feb. 24, 2022

(86) PCT No.: PCT/CN2022/077645
§ 371 (c)(1),
(2) Date: May 15, 2023

(87) PCT Pub. No.: WO2023/159419
PCT Pub. Date: Aug. 31, 2023

(65) Prior Publication Data
US 2024/0347681 A1 Oct. 17, 2024

(51) Int. Cl.
*H10H 20/857* (2025.01)
*H01L 25/16* (2023.01)
(Continued)

(52) U.S. Cl.
CPC ......... *H10H 20/857* (2025.01); *H01L 25/167* (2013.01); *H10D 86/411* (2025.01); *H10D 86/60* (2025.01)

(58) Field of Classification Search
None
See application file for complete search history.

(56) References Cited

U.S. PATENT DOCUMENTS 10,269,711 B1 * 4/2019 Liu .................. H01L 21/76897
2015/0123231 A1 5/2015 Chien et al.
(Continued)

FOREIGN PATENT DOCUMENTS

CN 104637827 A 5/2015
CN 105845587 A 8/2016
(Continued)

OTHER PUBLICATIONS

PCT/CN2022/077645 international search report.
PCT/CN2022/077645 Written Opinion.

*Primary Examiner* — Bo B Jang
(74) *Attorney, Agent, or Firm* — IPro, PLLC

(57) ABSTRACT

The present application provides an array substrate and a display device. The array substrate includes a base, a first insulating layer located on the base, a first conductive layer located on the first insulating layer, a second insulating layer located on the first conductive layer, and an electronic element located on the first conductive layer. The first insulating layer is provided with a plurality of first openings. The first conductive layer includes a plurality of pads, each of which is at least partially located in one of the first openings. The second insulating layer is provided with a plurality of second openings. An orthographic projection of each first opening on the base falls into that of one of the second openings on the base. The electronic element includes an electronic element body, and a plurality of pins located on a side of the electronic element body toward the base. Each of the pins is at least partially located in the first (Continued)

opening and the second opening, and is soldered with the pad. The display device includes the array substrate.

16 Claims, 6 Drawing Sheets

(51) Int. Cl.
  H10D 86/40         (2025.01)
  H10D 86/60         (2025.01)

(56)                References Cited

U.S. PATENT DOCUMENTS

| | | |
|---|---|---|
| 2016/0190080 A1 | 6/2016 | Chen et al. |
| 2019/0206798 A1* | 7/2019 | Collins ................... H01L 21/50 |
| 2020/0402965 A1* | 12/2020 | Ng .......................... H01L 24/19 |
| 2021/0028225 A1 | 1/2021 | Zhang |
| 2021/0391517 A1 | 12/2021 | Chuang et al. |

FOREIGN PATENT DOCUMENTS

| | | |
|---|---|---|
| CN | 109950270 A | 6/2019 |
| CN | 110350063 A | 10/2019 |
| CN | 111640722 A | 9/2020 |

* cited by examiner

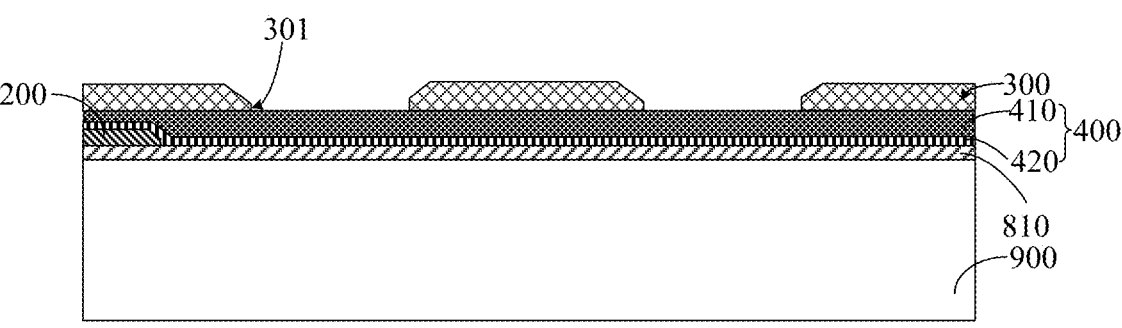
FIG. 10
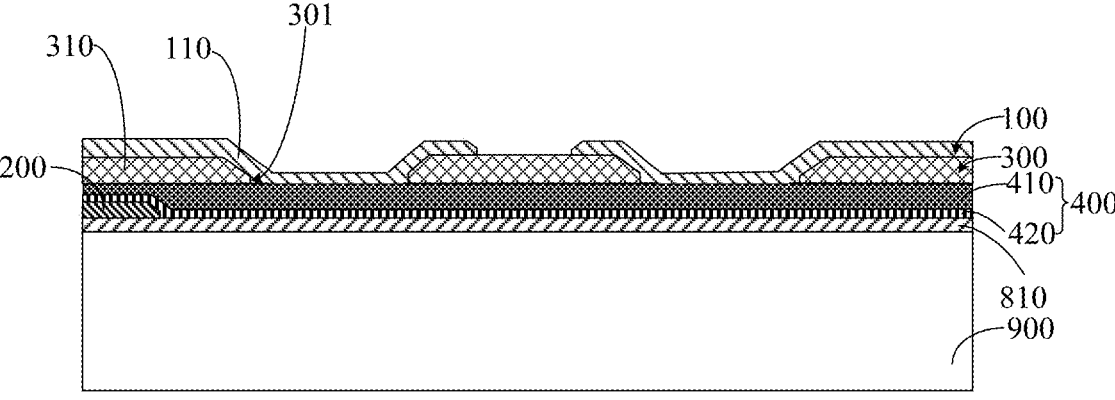
FIG. 11
FIG.12

ARRAY SUBSTRATES AND DISPLAY DEVICES

CROSS-REFERENCE TO RELATED APPLICATIONS

This application is a national stage of international PCT Application No. PCT/CN2022/077645 filed on Feb. 24, 2022, the entire contents of which are incorporated herein by reference.

TECHNICAL FIELD

The present application relates to the field of display technologies, and in particular, to an array substrate and a display device.

BACKGROUND

A micro light emitting diode has a size smaller than about 500 μm. Due to its advantages such as smaller size, ultra-high brightness and long service life, its use trend in the display field has been increased significantly.

SUMMARY

In the present application, an array substrate and a display device are provided.

In a first aspect of the examples of the present application, an array substrate is provided. The array substrate includes:
a base;
a first insulating layer located on the base and provided with a plurality of first openings;
a first conductive layer located on the first insulating layer and including a plurality of pads, where each of the plurality of pads is at least partially located in one of the plurality of first openings;
a second insulating layer located on the first conductive layer and provided with second openings, where an orthographic projection of each of the plurality of first openings onto the base is within an orthographic projection of one of the second openings onto the base;
an electronic element located on the first conductive layer, where the electronic element includes an electronic element body and a plurality of pins located on a side of the electronic element body toward the base, and each of the plurality of pins is at least partially located in the corresponding first opening and the corresponding second opening, and is soldered with the corresponding pad.

In an example, the first insulating layer includes a first organic layer.

In an example, the array substrate further includes: a first inorganic layer located between the first organic layer and the first conductive layer.

In an example, orthographic projections of the plurality of pads onto the base are within an orthographic projection of the first inorganic layer onto the base.

In an example, a thickness of the first inorganic layer is smaller than a thickness of the first organic layer.

In an example, the second insulating layer includes a first sub-insulating layer, and for each of the second openings, the second opening includes a first sub-opening disposed in the first sub-insulating layer; the electronic element body is at least partially located in the corresponding first sub-opening, and an orthographic projection of the electronic element body onto the base is within an orthographic projection of the corresponding first sub-opening onto the base; and an orthographic projection of each of the first sub-openings onto the base covers orthographic projections of a plurality of first openings onto the base.

In an example, the array substrate further includes: a protective material filled between the electronic element body and opening walls of the first sub-opening.

In an example, the protective material is a soldering flux.

In an example, the first sub-insulating layer includes a second organic layer.

In an example, the second insulating layer further includes a second sub-insulating layer located on a side of the first sub-insulating layer toward the base, and for each of the second openings, the second opening includes a plurality of second sub-openings disposed in the second sub-insulating layer; the orthographic projection of each of the plurality of first openings onto the base is within an orthographic projection of one of the plurality of second sub-openings onto the base, and the orthographic projection of each of the first sub-openings onto the base covers orthographic projections of the plurality of second sub-openings onto the base.

In an example, an edge of the orthographic projection of each of the plurality of first openings onto the base is inside an edge of the orthographic projection of one of the plurality of second sub-openings onto the base.

In an example, the second sub-insulating layer includes a second inorganic layer.

In an example, the electronic element includes an inorganic light emitting diode and/or a driver chip with a size of hundred microns or below.

In an example, the array substrate further includes: a third insulating layer located on a side of the first insulating layer toward the base, and a second conductive layer located between the third insulating layer and the base.

In an example, the third insulating layer includes a third organic layer.

In a second aspect of the examples of the present application, a display device is provided. The display device includes the array substrate.

For the array substrate and the display device in the examples of the present application, the pad is at least partially located in the first opening, that is, at least part of the pad is concave downwards in the first opening, and the orthographic projection of the first opening onto the base is within that of the second opening of the second insulating layer onto the base, so that the pad is not completely covered by the second insulating layer. In the process of soldering the pins of the electronic element with the pads, a solder coated on surfaces of the pins, after being melted, flows to the first openings to drive each of the pins to move to the pad with which the pin is soldered. The movement of the pins to the pads can reduce the offset of the electronic element relative to its soldering position, so that the pins can be effectively soldered with corresponding pads. Therefore, the problem of false soldering between the pin and the pad due to the offset of the electronic element can be avoided, and the yield of products can be increased.

BRIEF DESCRIPTION OF THE DRAWINGS

FIG. 10 is a partial sectional view of a second intermediate structure of an array substrate according to an example of the present application.

FIG. 11 is a partial sectional view of a third intermediate structure of an array substrate according to an example of the present application.

FIG. 12 is a partial sectional view of a fourth intermediate structure of an array substrate according to an example of the present application.

DETAILED DESCRIPTION OF THE EMBODIMENTS

Figure 1:
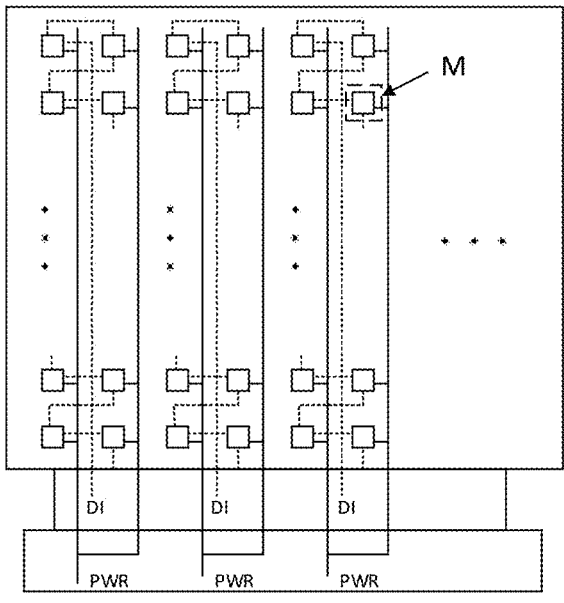
FIG. 1 is a schematic structural diagram of an array substrate according to an example of the present application.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present application. Rather, they are merely examples of apparatuses and methods consistent with some aspects of the present application as detailed in the appended claims.

The terms used in the present application are for the purpose of describing particular examples only, and are not intended to limit the present application. Terms determined by "a", "the" and "said" in their singular forms in the present application and the appended claims are also intended to include plurality, unless clearly indicated otherwise in the context. It should also be understood that the term "and/or" as used herein refers to and includes any and all possible combinations of one or more of the associated listed items.

It is to be understood that, although terms "first," "second," "third," and the like may be used in the present application to describe various information, such information should not be limited to these terms. These terms are only used to distinguish information of the same category from each other. For example, without departing from the scope of the present application, first information may be referred as second information; and similarly, second information may also be referred as first information. Depending on the context, the word "if" as used herein may be interpreted as "when" or "upon" or "in response to determining".

In the examples of the present application, an array substrate and a display device are provided. The array substrate and the display device in the examples of the present application will be described in detail below with reference to the accompanying drawings. The features in the examples may be supplemented or combined with each other in a case of no conflict.

In an example of the present application, an array substrate is provided. The array substrate includes a base, a first insulating layer located on the base, a first conductive layer located on the first insulating layer, a second insulating layer located on the first conductive layer, and an electronic element located on the first conductive layer.

The first conductive layer includes a plurality of pads, and each of the plurality of pads is at least partially located in a first opening. The second insulating layer is provided with second openings, and an orthographic projection of each first opening onto the base is within that of a second opening onto the base. The electronic element includes an electronic element body, and a plurality of pins located on a side of the electronic element body toward the base, where each of the plurality of pins is at least partially located in the corresponding first opening and the corresponding second opening, and is soldered with the corresponding pad.

For the array substrate in the examples of the present application, the pad is at least partially located in the first opening, that is, at least part of the pad is concave downwards in the first opening, and an orthographic projection of the first opening onto the base is within that of the second opening of the second insulating layer onto the base, so that the pad is not completely covered by the second insulating layer. In the process of soldering the pins of the electronic element with the pads, a solder coated on surfaces of the pins, after being melted, flows to the first openings to drive each of the pins to move to the pad with which the pin is soldered. The movement of the pins to the pads can reduce the offset of the electronic element relative to its soldering position, so that the pins can be effectively soldered with corresponding pads. Therefore, the problem of false soldering between the pins and the pads due to the offset of the electronic element can be avoided, and the yield of products can be increased.

In an example, the electronic element includes an inorganic light emitting diode with a size of hundred microns or below. In an example, the electronic element may include a driver chip with a size of hundred microns or below. The inorganic light emitting diode with a size of hundred microns or below may be mini LED or micro LED. A size of the mini LED is in the range from about 100 μm to 500 μm. A size of the micro LED is smaller than 100 μm. The driver chip may be a chip configured to provide signals to the inorganic light emitting diode, so that the inorganic light emitting diode emits light.

In an example, the array substrate includes a light emitting region and a binding region. Pads in the light emitting region are soldered with the inorganic light emitting diodes, and pads in the binding region are bound with the driver chips. The driver chips are configured to drive the inorganic light emitting diodes to emit light.

In an example, a solder, for example, a tin solder, is coated outside the pins of the electronic element. When the pins of the electronic element are soldered with the pads, metal in the solder coated outside the pins of the electronic element and metal in the pads diffuse or react with each other to generate an intermetallic compound IMC.

Figure 2:
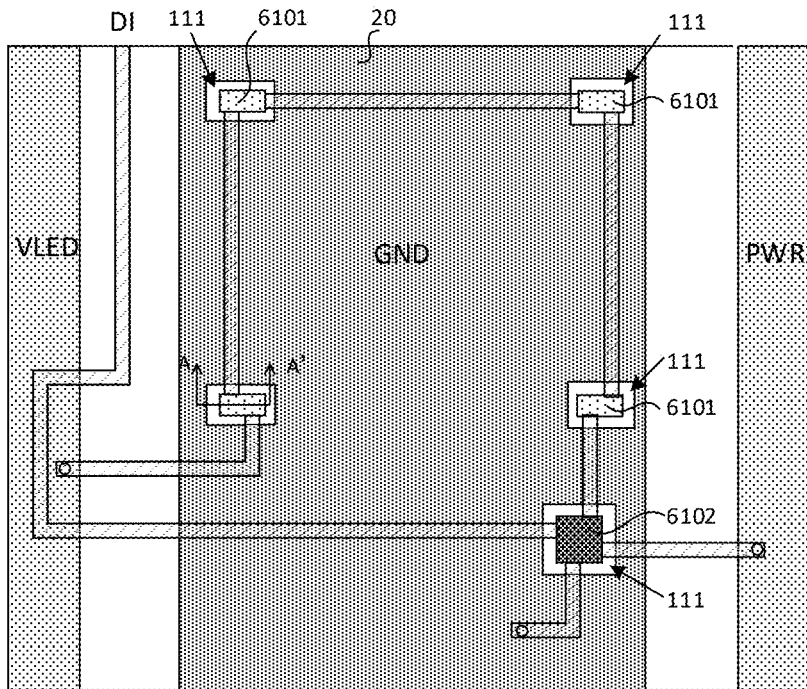
FIG. 2 is a partial enlarged view of a region M in the array substrate shown in FIG. 1.
Figure 3:
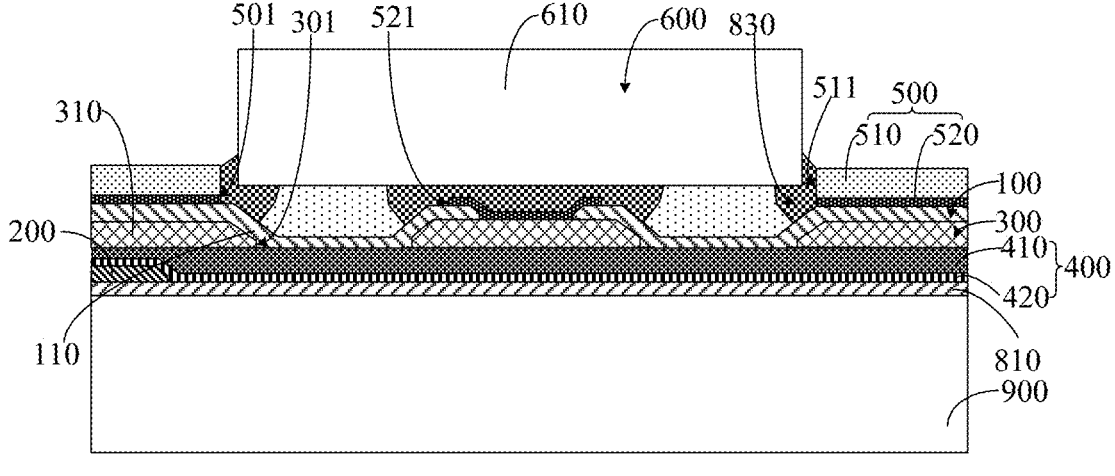
FIG. 3 is a partial sectional view of the array substrate shown in FIG. 2 along a direction of AA'.

FIGS. 1 to 3 show schematic structural diagrams of an array substrate according to an example of the present application. FIG. 2 is a partial enlarged view of a region M in FIG. 1, showing a structure of a light emitting unit. FIG. 3 is a partial sectional view of the array substrate shown in FIG. 1. The light emitting unit includes four inorganic light emitting diodes 6101 connected with each other in series, where an inorganic light emitting diode 6101 electrically connected with a drive voltage line VLED is used as a starting point of the series connection of the four inorganic light emitting diodes 6101, and an inorganic light emitting diode 6102 electrically connected with a driver chip 6102 is used as an end point of the series connection of the four inorganic light emitting diodes 6101. The four inorganic light emitting diodes are driven by one driver chip 6102.

It should be noted that, in the examples of the present application, the number of inorganic light emitting diodes in each light emitting unit is not limited, and may be any number, for example, five, six, seven or eight, but is not limited to four.

In the examples of the present application, as shown in FIGS. 2 and 3, the array substrate includes a base 900, a first conductive layer 100 and a second conductive layer 200. The first conductive layer 100 is disposed on a side of the base 900, and includes a first conductive portion 10. The second conductive layer 200 is disposed between the first conductive layer 100 and the base 900, and includes a second conductive portion 20. The second conductive portion 20 includes hollowed portions 111. Orthographic projections of the inorganic light emitting diodes 6101 and the driver chip 6102 onto the base 900 are respectively within an orthographic projection of the hollowed portion 111 onto the base 900. A first insulating layer 300 and a third insulating layer 400 are disposed between the first conductive layer 100 and the second conductive layer 200. The third insulating layer 400 is located on a side of the first insulating layer 300 toward the base 900. The second conductive layer 200 is located between the third insulating layer 400 and the base 900. A second insulating layer 500 is disposed on the first conductive layer 100.

In an example, the third insulating layer 400 includes a third organic layer 410. A thickness of the third organic layer 410 is larger, so that thicknesses of the insulating layers between the first conductive layer 100 and the second conductive layer 200 is larger.

Therefore, short circuit between the first conductive layer 100 and the second conductive layer 200 can be avoided. A sum of thicknesses of the third organic layer 410 and the first insulating layer 300 may be about 7 µm.

In an example, the third insulating layer 400 further includes a third inorganic layer 420 located on a side of the third organic layer 410 toward the base 900. The third inorganic layer 420 can prevent water vapor from penetrating into the second conductive layer 200 and causing corrosion to the second conductive layer 200, which is helpful to improve the insulation between the second conductive layer 200 and the first conductive layer 100. In addition, the hardness and compactness of the third inorganic layer 420 are superior to that of the third organic layer 410, and the adhesion between the third inorganic layer 420 and the second conductive layer 200 is better, which can avoid the separation between the second conductive layer 200 and the third insulating layer 400. The third inorganic layer 420 may be made of a material including at least one of silicon nitride or silicon oxide.

In an example, a thickness of the third inorganic layer 420 is smaller than that of the third organic layer 410.

In an example, the second conductive layer 200 is usually configured to arrange various signal lines, that is, the second conductive portion 20 may include various signal lines, such as a common voltage line GND, a drive voltage line VLED, a source power line PWR, and a source address line DI. In an example, a thickness of the second conductive layer 200 is in the range from about 1.5 µm to 7 µm, and the second conductive layer 200 may be made of a material including copper. For example, the second conductive layer 200 may be made of a laminated material of, for example, MoNb/Cu/MoNb, formed through sputtering, where a bottom layer made of MoNb (300 Å) is configured to improve adhesion, a middle layer made of Cu is configured to transmit electrical signals, and a top layer made of MoNb (200 Å) is configured to resist oxidation. The film layer can also be formed through electroplating. A seed layer made of MoNiTi may be first formed to improve the nucleation density of grains, and after electroplating, an oxidation resistant layer made of MoNiTi is formed.

The first conductive layer 100 includes pads configured to install an electronic element, and/or lead lines configured to transmit signals. In an example, a thickness of the first conductive layer 100 is about 6000 Å, and the first conductive layer 100 may be made of a laminated material of, for example, MoNb/Cu/CuNi, where a bottom layer made of MoNb is configured to improve adhesion, a middle layer made of Cu is configured to transmit electrical signals, and a top layer made of CuNi can give consideration to both oxidation resistance and die bond firmness.

In an example, the first conductive portion 10 includes multiple groups of pads. In this example, the pads may be pads configured to install functional devices, such as inorganic light emitting diodes and sensors, or pads configured to install driver chips.

With reference to FIG. 3, taking a group of pads configured to install an inorganic light emitting diode as an example, this group of pads includes two pads 110, one of the two pads 110 is an anode pad, and the other one of the two pads 110 is a cathode pad.

In an example, a group of pads configured to install a driver chip includes four pads, where one pad is configured to be soldered with an address pad of the driver chip, one pad is configured to be soldered with an output pad of the driver chip, one pad is configured to be soldered with a power pad of the driver chip, and one pad is configured to be soldered with a common voltage pad of the driver chip.

Figure 4:
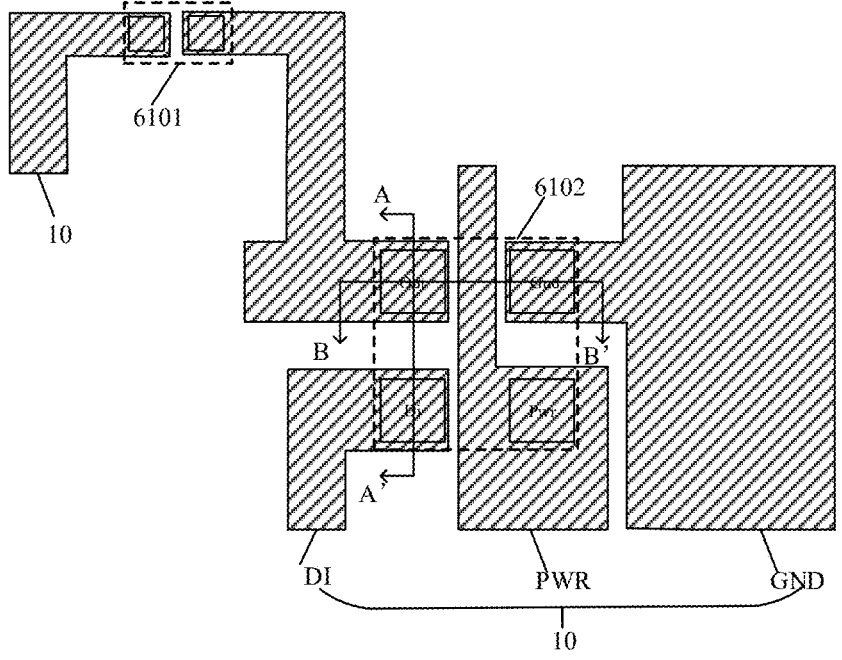
FIG. 4 is a schematic partial structural diagram of an array substrate according to an example of the present application.
Figure 5:
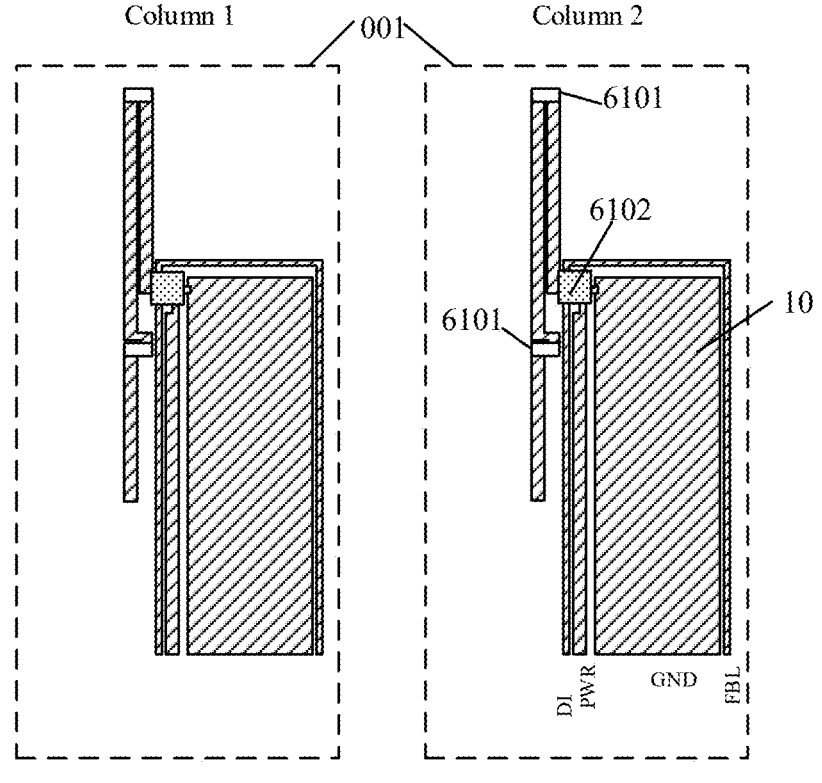
FIG. 5 is a schematic partial structural diagram of the array substrate shown in FIG. 4.
Figure 6:
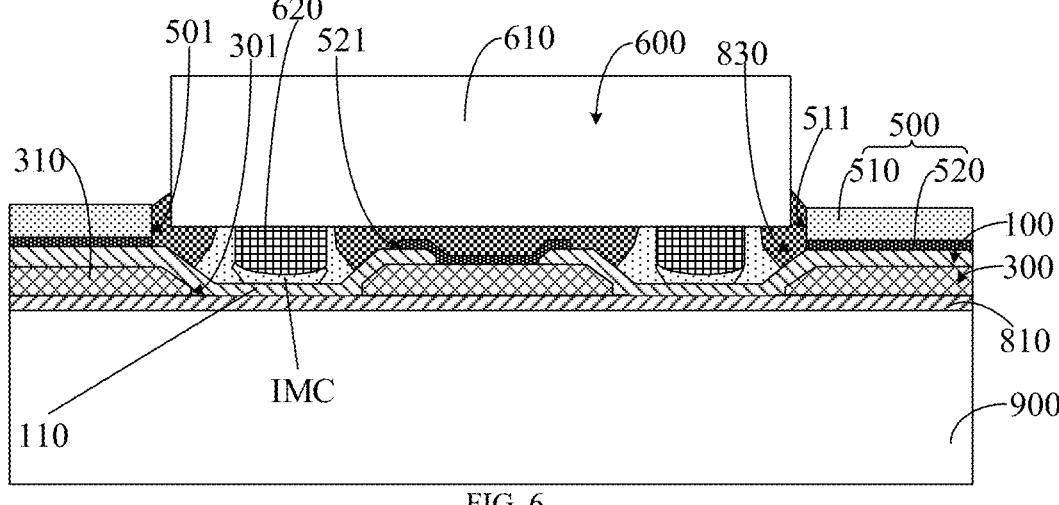
FIG. 6 is a partial sectional view of the array substrate shown in FIG. 4 along the direction of AA'.

FIGS. 4 to 8 show schematic structural diagrams of an array substrate according to an example of the present application. FIG. 4 is a schematic layout diagram of pads of the array substrate. FIG. 5 is a schematic partial enlarged diagram of the array substrate. The array substrate may include multiple rows and multiple columns of light emitting regions, where each row of light emitting regions is provided with a plurality of inorganic light emitting diodes arranged along a row direction, each column of light emitting regions is provided with a plurality of inorganic light emitting diodes arranged along a column direction, and each light emitting region can be provided with one inorganic light emitting diode. FIG. 5 shows only a first column of light emitting regions 001 and a second column of light emitting regions 001.

As shown in FIGS. 4 to 8, the array substrate includes a base 900, and a first conductive layer 100 located on the base 900. The first conductive layer 100 may include the first conductive portion 10 and the second conductive portion 20, that is, the first conductive portion 10 and the second conductive portion 20 are located on a same layer. A second insulating layer 500 is disposed on the first conductive layer 100.

The first conductive portion 10 may include a plurality of signal lines and traces connecting driver chips and inorganic light emitting diodes. The plurality of signal lines include a common voltage line GND, a drive voltage line VLED, a source power line PWR, a source address line DI, a feedback signal line FBL, etc. The second conductive portion 20 includes a plurality of pads, which are divided into, for example, pads connected with driver chips 6102 and pads connected with inorganic light emitting diodes. By arranging the first conductive portion 10 and the second conductive portion 20 on the same layer, a single conductive layer can be configured not only to produce the plurality of pads in the second conductive portion 20 and the traces connecting driver chips and inorganic light emitting diodes, but also to produce the plurality of signal lines in the first conductive portion 10, so as to transmit corresponding electrical signals to the driver chips and the inorganic light emitting diodes.

As shown in FIG. 4, one driver chip 6102 includes four pins, corresponding to four pads, which are an address pad Di, a power pad Pwr, a common voltage pad Gnd, and an output pad Out. One inorganic light emitting diode includes two pins, corresponding to two pads, one of the two pads is an anode pad, and the other one of the two pads is a cathode pad. The output pad Out of the driver chip is connected with one pad of at least one inorganic light emitting diode; the common voltage pad Gnd of the driver chip is connected with the common voltage line GND, so as to receive a common voltage (for example, a grounding voltage) transmitted by the common voltage line GND; the power pad Pwr of the driver chip is connected with the source power line PWR. The drive voltage line VLED is connected with one pad of the inorganic light emitting diode. The source address line DI is connected with the address pad Di of a first-level driver chip in each column of light emitting regions 001, and is configured to transmit an address signal to the first-level driver chip in each column of light emitting regions 001.

In an example, as shown in FIG. 3 and FIGS. 6 to 8, an edge of an orthographic projection of each pad 110 onto the base 900 is located outside an edge of an orthographic projection of one first opening 301 onto the base 900. That is to say, the pad 110 is located partially in the first opening 301; and the pad 110 is located partially outside the first opening 301, i.e., on a side of the first insulating layer 300 away from the base 900.

In an example, as shown in FIG. 3 and FIGS. 6 to 8, the first insulating layer 300 includes a first organic layer 310.

In some examples, a thickness of the first organic layer 310 is in the range from 2 μm to 4 μm. With such configuration, the process can be easily implemented, and the thickness of the first organic layer 310 is too large, resulting in a large thickness of the array substrate can also be avoided. In some examples, the thickness of the first organic layer 310 is, for example, 2 μm, 2.5 μm, 3 μm, 3.5 μm or 4 μm.

In an example, the first organic layer 310 is a single film layer, or the first organic layer 310 includes a plurality of sub-organic layers, that is, the first organic layer 310 is formed through multiple coating. The first organic layer 310 may be made of organic resin.

In an example, the first insulating layer 300 may include only the first organic layer 310.

Figure 7:
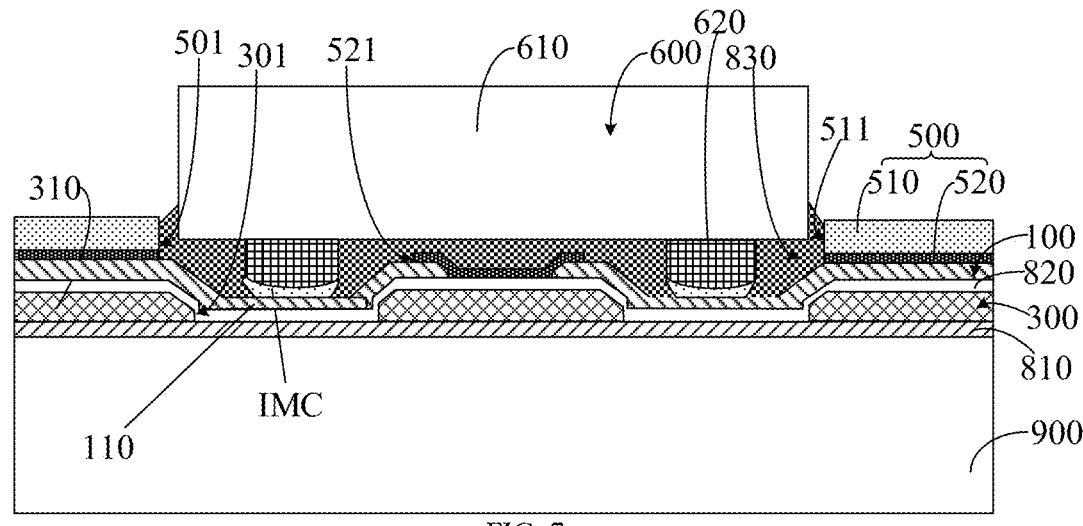
FIG. 7 is another partial sectional view of the array substrate shown in FIG. 4 along the direction of AA'.

In an example, as shown in FIG. 7, the array substrate further includes a first inorganic layer 820 located between the first organic layer 310 and the first conductive layer 100. The hardness and compactness of the first inorganic layer 820 is superior to that of the first organic layer 310. By disposing the first inorganic layer 820 between the first organic layer 310 and the first conductive layer 100, the adhesion between the first inorganic layer 820 and the first conductive layer 100 is greater, which can avoid the separation between the first conductive layer 100 and an adjacent film layer.

In an example, a thickness of the first inorganic layer 820 is smaller than that of the first organic layer 310. With such configuration, the manufacture of the first inorganic layer 820 is simple and easy to be implemented. Moreover, the provision of the first inorganic layer 820 will not increase the thickness of the array substrate too much, which is helpful to realize the thinning of the array substrate. The first inorganic layer 820 may be made of a material including at least one of silicon nitride or silicon oxide.

In some examples, the thickness of the first inorganic layer 820 is in the range from 0.1 μm to 0.3 μm. With such configuration, it can be not only avoided that the thickness of the first inorganic layer 820 is too large, resulting in an increased manufacturing time of the first inorganic layer 820, but also avoided that the thickness of the first inorganic layer 820 is too small to make its thickness uneven, the first inorganic layer 820 cannot effectively cover the first organic layer 310 located below the first conductive layer 100, and thus the adhesion between the first conductive layer 100 and its lower film layer cannot be effectively increased. The thickness of the first inorganic layer 820 is, for example, 0.1 μm, 0.15 μm, 0.2 μm, 0.25 μm or 0.3 μm.

In an example, when the array substrate is an array substrate shown in FIGS. 1 to 3, the array substrate may further include the first inorganic layer located between the first organic layer 310 and the first conductive layer 100, so that the adhesion between the first conductive layer 100 and the first inorganic layer is greater, which can avoid the separation between the first conductive layer 100 and adjacent film layers.

In an example, an orthographic projection of the pad 110 onto the base 900 is within that of the first inorganic layer 820 onto the base 900. In this way, the provision of the first inorganic layer 820 will not increase a segment difference between a part of the pad 110 located in the first opening 301 and a part of the pad 110 located outside the first opening 301, so that the disconnection of the pad 110 at a side wall of the first opening 301 due to a large segment difference between the part of the pad 110 located in the first opening 301 and the part of the pad 110 located outside the first opening 301 can be avoided. Therefore, the adhesion between the first conductive layer 100 and its lower film layer can be improved while not affecting the yield of the array substrate.

In an example, as shown in FIG. 3 and FIGS. 6 to 8, the second insulating layer 500 includes a first sub-insulating layer 510, and each of second openings 501 disposed in the second insulating layer 500 includes a first sub-opening 511 disposed in the first sub-insulating layer 510. An electronic element body 610 of an electronic element 600 is at least partially located in the first sub-opening 511, and an orthographic projection of the electronic element body 610 onto the base 900 is within that of one first sub-opening 511 onto the base 900. An orthographic projection of each first sub-opening 511 onto the base 900 covers that of a plurality of first openings 301 onto the base 900.

By disposing the first sub-openings 511 on the first sub-insulating layer 510, when the electronic element 600 is aligned with the pads, the electronic element body 610 of the electronic element 600 is placed in the first sub-opening 511, so as to realize the preliminary positioning of the electronic element 600, which is helpful to avoid the position of the electronic element 600 from deviating greatly, and further to avoid the false soldering between pins of the electronic element 600 and corresponding pads 110. In addition, no first sub-insulating layer 510 is disposed between the electronic element body 610 and the pads. The electronic element body 610 is relatively stable in the first sub-opening 511, and will not tilt toward a side. Thus, the problem of false soldering between pins located on another side and the pads 110 due to the tilt of the electronic element toward a side can be avoided. By configuring the orthographic projection of each first sub-opening 511 onto the base 900 to cover that of a plurality of first openings 301 onto the base 900, it is ensured that the electronic element 600 can be soldered with the pads in a plurality of its corresponding first openings 301.

In an example, the first sub-insulating layer 510 includes a second organic layer. With such configuration, a thickness of the first sub-insulating layer 510 is generally larger, which can make the electronic element 600 more firmly positioned in the first sub-opening 511. In addition, a second inorganic layer can protect the array substrate from being damaged while playing a role in preventing the invasion of water vapor.

In some examples, the first sub-insulating layer 510 may include only the second organic layer. The second organic layer is a single film layer, or the second organic layer includes a plurality of sub-organic layers, that is, the second organic layer is formed through multiple coating.

In an example, a thickness of the second organic layer is in the range from 2 μm to 5 μm. The thickness of the second organic layer is, for example, 2 μm, 2.5 μm, 3 μm, 3.5 μm, 4 μm, 4.5 μm or 5 μm. The second organic layer may be made of organic resin.

In an example, the second insulating layer 500 further includes a second sub-insulating layer 520 located on a side of the first sub-insulating layer 510 toward the base, and the second opening 501 disposed in the second insulating layer 500 further includes a plurality of second sub-openings 521 disposed in the second sub-insulating layer 520. An orthographic projection of each first opening 301 onto the base 900 is within that of one second sub-opening 521 onto the base 900, and an orthographic projection of each first sub-opening 511 onto the base 900 covers that of the plurality of second sub-openings 521 onto the base 900.

In an example, an edge of the orthographic projection of each first opening 301 onto the base 900 is located inside an edge of the orthographic projection of one second sub-opening 521 onto the base 900. The first openings 301 can correspond to the second sub-openings 521 one to one, and a size of the second sub-opening 521 is greater than that of a corresponding first opening 301. In this way, the second sub-openings 521 will not affect the contact between the pins and the pads 110.

In an example, each first sub-opening 511 corresponds to a plurality of second sub-openings 521 in a laminating direction of film layers in the array substrate, and an edge of an orthographic projection of the first sub-opening 511 onto the base 900 can coincide with an outermost one of edges of orthographic projections of the corresponding plurality of second sub-openings 521 onto the base 900.

In an example, the second sub-insulating layer 520 includes a second inorganic layer. Due to the large surface roughness of the inorganic layer, by disposing the second inorganic layer between the second organic layer and the first conductive layer 100, the adhesion between the second inorganic layer and the first conductive layer 100 is greater, which can avoid the separation between the first conductive layer 100 and the second insulating layer 500. In addition, the second inorganic layer is helpful to block water vapor, reduce the amount of water vapor invading the pads, and improve the reliability of the array substrate.

In an example, the second inorganic layer may be made of a material including at least one of silicon nitride or silicon oxide. A thickness of the second inorganic layer is in the range from 0.1 μm to 0.3 μm. In this way, it can be not only avoided that the thickness of the second organic layer is too small, resulting in a great difficulty in manufacturing process and a poor effect of the second inorganic layer on blocking water vapor, but also avoided that the thickness of the second inorganic layer is too large, resulting in an increased thickness of the array substrate. In some examples, the thickness of the second inorganic layer is, for example, 0.1 μm, 0.15 μm, 0.2 μm, 0.25 μm or 0.3 μm.

In an example, as shown in FIG. 3 and FIGS. 6 to 8, the array substrate further includes a protective material 830 filled between the electronic element body 610 and opening walls of the first sub-opening 511. The protective material 830 is accumulated between the electronic element body 610 and the opening walls of the first sub-opening 511 to fill gaps between the electronic element body 610 and the opening walls of the first sub-opening 511, so as to prevent water vapor from invading a conductive structure below the electronic element body 610 and causing corrosion, which is helpful to improve the service life and reliability of the array substrate.

In an example, gaps between the electronic element body 610 and the pads 110 are also filled with the protective material 830. In this way, the sealing between the electronic element body 610 and its lower structure is better, which is more helpful to prevent the invasion of external water and oxygen.

In an example, the protective material 830 is a soldering flux. The soldering flux is relatively viscous, which is helpful to adhere the pins of the electronic element 600 to the pads 110 and prevent the deviation of the electronic element 600 when the pins of the electronic element 600 are aligned with the pads 110. In addition, the soldering flux can remove impurities on surfaces of the pads, which is helpful to solder the pins and the pads 110. The soldering flux generally includes rosin, resin, activator, thixotropic agent, etc., where rosin and resin are non-volatile substances. Since the fluidity of the soldering flux is greater than that of an intermetallic compound IMC, after the completion of soldering, the unvolatilized soldering flux is extruded by the intermetallic compound IMC and accumulated between the electronic element 600 and opening walls of the second opening 501. In this way, there is no need to provide additional protective material, and the unvolatilized part of the soldering flux used during the soldering serves as the protective material, which is helpful to simplify the manufacturing process and save the cost of the array substrate.

Figure 8:
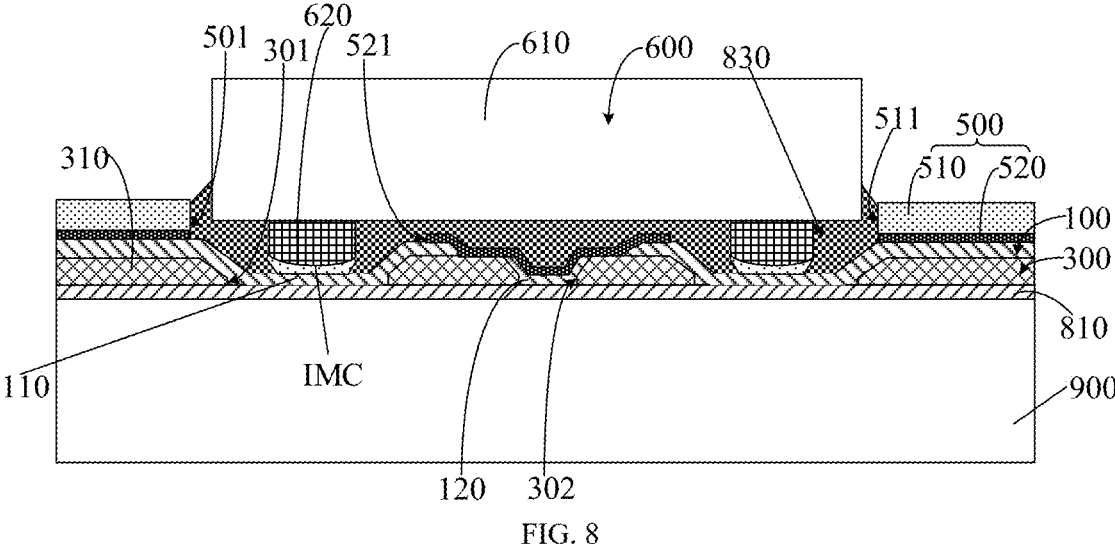
FIG. 8 is another partial sectional view of the array substrate shown in FIG. 4 along a direction of BB'.

In an example, as shown in FIG. 8, when the array substrate includes a conductive layer, that is, the first conductive layer 100, the first conductive layer 100 further includes a lead line 120 located between adjacent pads 110.

In some examples, the first insulating layer 300 is provided with a groove 302 located between adjacent first openings 301, and the lead line 120 is at least partially located in the groove 302. In this way, it can be avoided that the provision of the lead line 120 between adjacent pads 110 makes thicknesses of film layers between the electronic element body 610 and the lead line 120 larger, resulting in that the pins of the electronic element 600 and corresponding pads cannot effectively contact, which will cause the problem of false soldering.

In some examples, the groove 302 penetrates the first insulating layer 300. In this way, the groove 302 and the first openings 301 can be formed in the same process step, and the complexity of the manufacturing process will not be increased. In other examples, the groove 302 may not penetrate the first insulating layer 300.

In an example, the array substrate further includes a passivation protective layer 810 located on a side of the base 900 toward the first conductive layer 100, and the passivation protective layer 810 can be in direct contact with the base 900. The passivation protective layer 810 can protect the base 900 from being damaged when film layers located above the base 900 are etched. The passivation protective layer 810 may be made of an inorganic material, for example, silicon nitride or silicon oxide.

In an example, the base 900 may be a rigid base, and the rigid base may be made of, for example, glass or silicon. The base 900 may be a flexible base, and the flexible base may be made of a material including, for example, one or more of polyimide, polyethylene terephthalate or polycarbonate.

In an example of the present application, a method of manufacturing an array substrate is provided. A process of manufacturing the array substrate will be introduced below. A "patterning technology" mentioned in the examples of the present application include depositing film layer, coating photoresist, mask exposing, developing, etching, stripping photoresist and other processing. Depositing may be selected from any one or more of sputtering, evaporating or chemical vapor deposition. Etching may be selected from any one or more of dry etching or wet etching. A "film" refers to a layer of thin film manufactured by depositing or coating a material on a base. If no patterning technology is needed in the whole process of manufacturing the "film", the "film" may also be called "layer". If a patterning technology is needed in the whole process of manufacturing the "film", the "film" is called "film" before the patterning technology and "layer" after the patterning technology. The "layer" after the patterning technology includes at least one "pattern".

The method of manufacturing an array substrate includes the following process:

First, a base is provided.

Subsequently, a functional layer is formed on the base.

In an example, when the array substrate is an array substrate shown in FIGS. 4 to 8, the functional layer is the passivation protective layer 810. The step of forming the functional layer on the base includes: forming the passivation protective layer 810 on the base.

In another example, when the array substrate is an array substrate shown in FIGS. 1 to 3, the functional layer includes the passivation protective layer 810, the second conductive layer 200 and the third insulating layer 400. The step of forming the functional layer on the base includes: first, forming the passivation protective layer on the base; thereafter, depositing a second conductive film on the passivation protective layer, and obtaining the second conductive layer by patterning the second conductive film through a patterning technology; and sequentially depositing a third inorganic layer and a third organic layer to obtain the third insulating layer.

Figure 9:
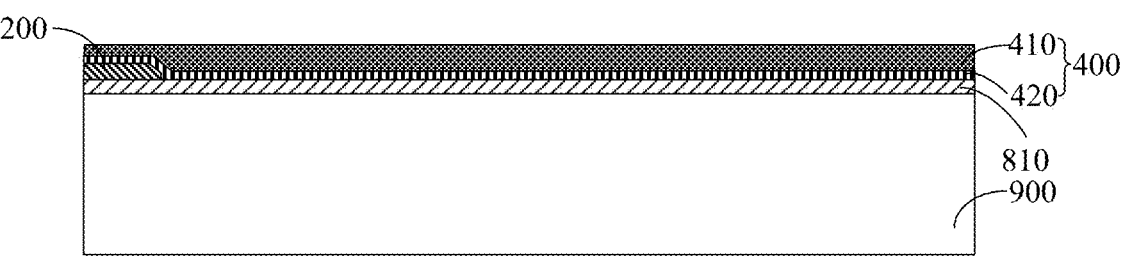
FIG. 9 is a partial sectional view of a first intermediate structure of an array substrate according to an example of the present application.

When the array substrate is the array substrate shown in FIGS. 1 to 3, a first intermediate structure as shown in FIG. 9 is obtained from the step of forming the functional layer on the base. As shown in FIG. 9, the second conductive layer 200 is located between the passivation protective layer 810 and the third insulating layer 400. The third insulating layer 400 includes the third inorganic layer 420, and the third organic layer 410 located on a side of the third inorganic layer 420 away from the base 900. It should be noted that intermediate structures obtained from subsequent process steps are illustrated only with the array substrate shown in FIGS. 1 to 3 as an example.

Then, a first insulating film is deposited on the functional layer, and a first insulating layer is obtained by patterning the first insulating film through a patterning technology, where a plurality of first openings are formed on the first insulating layer.

A second intermediate structure as shown in FIG. 10 can be obtained from this step. As shown in FIG. 10, the first insulating layer 300 is provided with a plurality of first openings 301 arranged at intervals.

Then, a first conductive film is deposited on the first insulating layer, and a first conductive layer is obtained by patterning the first conductive film through a patterning technology, where the first conductive layer includes a plurality of pads, each of which is at least partially located in a corresponding first opening.

A third intermediate structure as shown in FIG. 11 can be obtained from this step. As shown in FIG. 11, the first conductive layer 100 is located on the first insulating layer 300, and the first conductive layer 100 includes a plurality of pads 110, each of which is partially located in one first opening 301.

Then, a first inorganic film is deposited, and a plurality of second sub-openings are formed by patterning the first inorganic film through a patterning technology to obtain a second inorganic layer, that is, a second sub-insulating layer. An orthographic projection of each first opening onto the base is within that of one second sub-opening onto the base.

A fourth intermediate structure as shown in FIG. 12 can be obtained from this step. As shown in FIG. 12, the second sub-insulating layer 520 is provided with the second sub-openings 521 corresponding to the first openings 301 one to one, and an edge of the orthographic projection of each first opening 301 onto the base 900 is located inside an edge of the orthographic projection of one second sub-opening 521 onto the base 900.

Then, a second organic film is deposited, and a plurality of first sub-openings are formed by patterning the second organic film through a patterning technology to obtain a second organic layer, that is, a first sub-insulating layer. A second insulating layer including the first sub-insulating layer and the second sub-insulating layer is obtained. An orthographic projection of each first sub-opening onto the base covers that of a plurality of second sub-openings onto the base.

Figure 13:
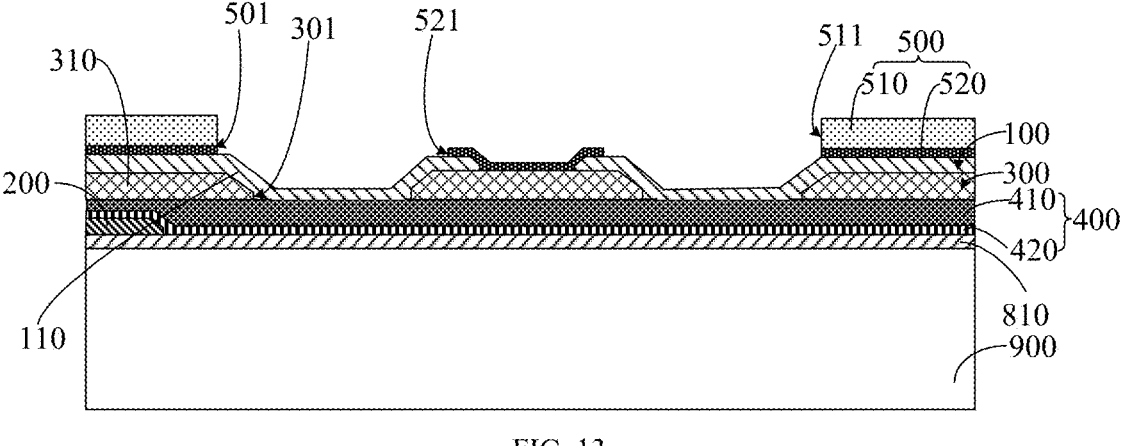
FIG. 13 is a partial sectional view of a fifth intermediate structure of an array substrate according to an example of the present application.

A fifth intermediate structure as shown in FIG. 13 can be obtained from this step. As shown in FIG. 13, the first sub-insulating layer 510 is provided with the plurality of first sub-openings 511, and the orthographic projection of each first sub-opening 511 onto the base 900 covers that of a plurality of second sub-openings 521 onto the base 900.

Then, a side of an electronic element provided with pins, after dipped in a soldering flux, is placed in the first sub-opening, and each pin of the electronic element is located in one first opening.

Figure 14:
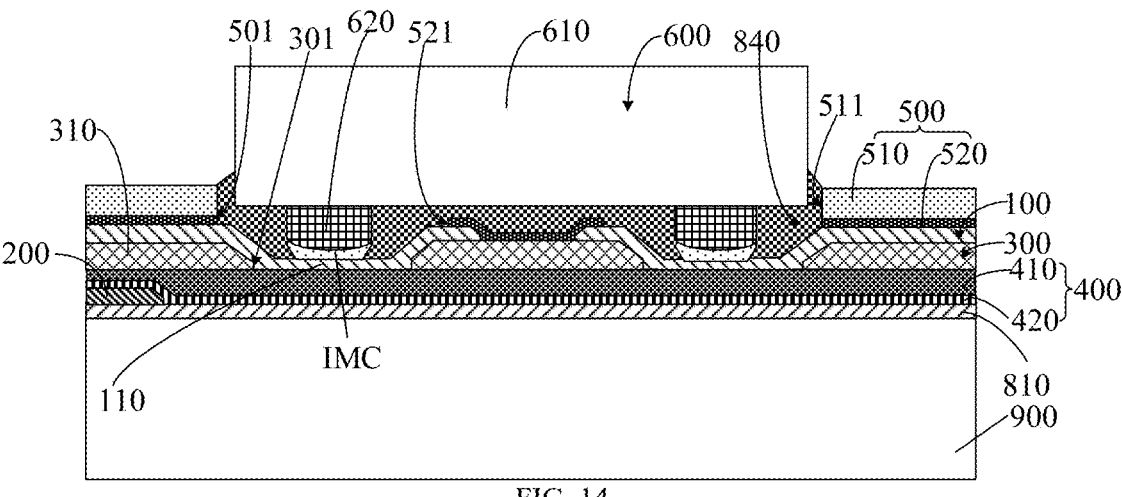
FIG. 14 is a partial sectional view of a sixth intermediate structure of an array substrate according to an example of the present application.

A sixth intermediate structure as shown in FIG. 14 can be obtained from this step. As shown in FIG. 14, the electronic element 600 includes an electronic element body 610, and a plurality of pins 620 located on a side of the electronic element body 610. Outsides of the pins 620 are coated with a solder, which may be a tin solder. The electronic element body 610 is partially located in the first sub-opening 511. Each pin 620 is opposite to one pad 110. The soldering flux

840 fills gaps between the electronic element 600 and the pads 110 and between the electronic element 600 and the second insulating layer 500.

Then, the pins of the electronic element are soldered together with corresponding pads through reflow soldering.

The array substrate as shown in FIG. 3, 6, 7 or 8 can be obtained from this step. During the reflow soldering, metal in the solder coated on surfaces of the pins 620 of the electronic element 600 and metal in the pads diffuse or react with each other to generate an intermetallic compound IMC, and the unvolatilized soldering flux, as a protective material 830, is accumulated between the electronic element body 610 and the second insulating layer 500, which can play a role in preventing the invasion of water vapor and improve the reliability of the array substrate.

The method of manufacturing an array substrate in the examples of the present application belongs to the same inventive concept as the array substrate. The description of relevant details and beneficial effects may be referred to each other, and will not be repeated.

In an example of the present application, a display device is provided. The display device includes the array substrate described in any one of the above examples. Since the display device includes the array substrate, the display device has the same beneficial effects, which will not be repeated in the present application.

In some examples, the display device may be a liquid crystal display device, which includes a liquid crystal panel, and a backlight source disposed on a non-display side of the liquid crystal panel. The backlight source includes the array substrate described in any one of the above examples. The liquid crystal display device can have more uniform backlight brightness and better display contrast.

In another example, the array substrate in the display device is used as a display substrate. When the array substrate is used as the display substrate, each inorganic light emitting diode is used as one sub-pixel.

The present application does not have specific limitation on the application of the display device, which may be any product or component with a display function, such as a television, a notebook computer, a tablet computer, a wearable display device, a mobile phone, a car monitor, a navigator, an e-book, a digital photo frame or an advertising lamp box.

It should be pointed out that, in the drawings, sizes of layers and areas may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. It will also be understood that when a layer or element is referred to as being "between" two layers or elements, it can be the only layer between the two layers or elements, or more than one intermediate layer or element may be present. Similar reference signs indicate similar elements throughout the present application.

Other embodiments of the present application will be readily apparent to those skilled in the art after considering the specification and practicing the contents disclosed herein. The present application is intended to cover any variations, uses, or adaptations of the present application, which follow the general principle of the present application and include common knowledge or conventional technical means in the art that are not disclosed in the present application. The specification and examples are to be regarded as illustrative only. The true scope and spirit of the present application are pointed out by the following claims.

It is to be understood that the present application is not limited to the precise structures that have described and shown in the drawings, and various modifications and changes can be made without departing from the scope thereof. The scope of the application is to be limited only by the appended claims.

The invention claimed is:

1. An array substrate, comprising:
   a base;
   a first insulating layer located on the base and provided with a plurality of first openings;
   a first conductive layer located on the first insulating layer and comprising a plurality of pads, wherein each of the plurality of pads is at least partially located in one of the plurality of first openings;
   a second insulating layer located on the first conductive layer and provided with second openings, wherein an orthographic projection of each of the plurality of first openings onto the base is within an orthographic projection of one of the second openings onto the base;
   an electronic element located on the first conductive layer, wherein the electronic element comprises an electronic element body and a plurality of pins located on a side of the electronic element body toward the base, and each of the plurality of pins is at least partially located in the corresponding first opening and the corresponding second opening, and is soldered with the corresponding pad;
   wherein the second insulating layer comprises a first sub-insulating layer,
   for each of the second openings, the second opening comprises a first sub-opening disposed in the first sub-insulating layer;
   the electronic element body is at least partially located in the corresponding first sub-opening, and an orthographic projection of the electronic element body onto the base is within an orthographic projection of the corresponding first sub-opening onto the base; and
   an orthographic projection of each of the first sub-openings onto the base covers orthographic projections of a plurality of first openings onto the base;
   wherein the array substrate further comprises: a protective material filled between the electronic element body and opening walls of the first sub-opening.

2. The array substrate according to claim 1, wherein the first insulating layer comprises a first organic layer.

3. The array substrate according to claim 2, further comprising: a first inorganic layer located between the first organic layer and the first conductive layer.

4. The array substrate according to claim 3, wherein orthographic projections of the plurality of pads onto the base are within an orthographic projection of the first inorganic layer onto the base.

5. The array substrate according to claim 3, wherein a thickness of the first inorganic layer is smaller than a thickness of the first organic layer.

6. The array substrate according to claim 1, wherein the protective material is a soldering flux.

7. The array substrate according to claim 1, wherein the first sub-insulating layer comprises a second organic layer.

8. The array substrate according to claim 1, wherein the second insulating layer further comprises a second sub-insulating layer located on a side of the first sub-insulating layer toward the base, for each of the second openings, the second opening comprises a plurality of second sub-openings disposed in the second sub-insulating layer;

the orthographic projection of each of the plurality of first openings onto the base is within an orthographic projection of one of the plurality of second sub-openings onto the base, and the orthographic projection of each of the first sub-openings onto the base covers orthographic projections of the plurality of second sub-openings onto the base.

9. The array substrate according to claim 8, wherein an edge of the orthographic projection of each of the plurality of first openings onto the base is inside an edge of the orthographic projection of one of the plurality of second sub-openings onto the base.

10. The array substrate according to claim 8, wherein the second sub-insulating layer comprises a second inorganic layer.

11. The array substrate according to claim 1, wherein the electronic element comprises an inorganic light emitting diode with a size of hundred microns or below.

12. The array substrate according to claim 1, further comprising:

a third insulating layer located on a side of the first insulating layer toward the base, and a second conductive layer located between the third insulating layer and the base.

13. The array substrate according to claim 12, wherein the third insulating layer comprises a third organic layer.

14. A display device, comprising: the array substrate according to claim 1.

15. The array substrate according to claim 1, wherein the electronic element comprises a driver chip with a size of hundred microns or below.

16. An array substrate, comprising:

a base;

a first insulating layer located on the base and provided with a plurality of first openings;

a first conductive layer located on the first insulating layer and comprising a plurality of pads, wherein each of the plurality of pads is at least partially located in one of the plurality of first openings;

a second insulating layer located on the first conductive layer and provided with second openings, wherein an orthographic projection of each of the plurality of first openings onto the base is within an orthographic projection of one of the second openings onto the base;

an electronic element located on the first conductive layer, wherein the electronic element comprises an electronic element body and a plurality of pins located on a side of the electronic element body toward the base, and each of the plurality of pins is at least partially located in the corresponding first opening and the corresponding second opening, and is soldered with the corresponding pad;

wherein the second insulating layer comprises a first sub-insulating layer, for each of the second openings, the second opening comprises a first sub-opening disposed in the first sub-insulating layer;

the electronic element body is at least partially located in the corresponding first sub-opening, and an orthographic projection of the electronic element body onto the base is within an orthographic projection of the corresponding first sub-opening onto the base; and an orthographic projection of each of the first sub-openings onto the base covers orthographic projections of a plurality of first openings onto the base;

wherein the second insulating layer further comprises a second sub-insulating layer located on a side of the first sub-insulating layer toward the base, for each of the second openings, the second opening comprises a plurality of second sub-openings disposed in the second sub-insulating layer;

the orthographic projection of each of the plurality of first openings onto the base is within an orthographic projection of one of the plurality of second sub-openings onto the base, and the orthographic projection of each of the first sub-openings onto the base covers orthographic projections of the plurality of second sub-openings onto the base.

* * * * *